United States Patent

Taskar et al.

[11] Patent Number: 5,915,164
[45] Date of Patent: Jun. 22, 1999

[54] METHODS OF MAKING HIGH VOLTAGE GAN-A1N BASED SEMICONDUCTOR DEVICES

[75] Inventors: Nikhil R. Taskar, Rego Park; Piotr M. Mensz; Babar A. Khan, both of Ossining, all of N.Y.

[73] Assignee: U.S. Philips Corporation, New York, N.Y.

[21] Appl. No.: 08/583,148

[22] Filed: Dec. 28, 1995

[51] Int. Cl.⁶ ................................................. H01L 21/00
[52] U.S. Cl. .............................................. 438/47; 438/604
[58] Field of Search ................................. 438/22, 46, 47, 438/93, 94, 172, 602, 604, 606

[56] References Cited

U.S. PATENT DOCUMENTS

| | | | |
|---|---|---|---|
| 4,903,088 | 2/1990 | Van Opdorp | 257/76 |
| 5,122,845 | 6/1992 | Manabe et al. | 257/76 |
| 5,192,987 | 3/1993 | Khan et al. | 257/183.1 |
| 5,205,905 | 4/1993 | Kotaki et al. | 438/606 |
| 5,210,051 | 5/1993 | Carter, Jr. | 438/22 |
| 5,369,289 | 11/1994 | Tamaki et al. | 257/99 |
| 5,393,993 | 2/1995 | Edmond et al. | 257/77 |
| 5,496,766 | 3/1996 | Amano et al. | 438/46 |

Primary Examiner—Chandra Chaudhari
Attorney, Agent, or Firm—Norman N. Spain

[57] ABSTRACT

The present invention is directed to a technique for manufacturing semiconductor devices in which p type GaN is formed on a substrate and semi-insulating AlN is formed on the P type GaN with n type GaN formed on the p type GaN and partially below the AlN. Highly efficient high power and high voltage semiconductor devices are formed through this technique having better or similar properties to silicon type semiconductors.

7 Claims, 4 Drawing Sheets

METHODS OF MAKING HIGH VOLTAGE GAN-AlN BASED SEMICONDUCTOR DEVICES

The present invention involves the structure and formation of high voltage semiconductor devices which in particular have GaN or AlN based p-n junction features.

BACKGROUND OF THE INVENTION

Silicon based semiconducting devices have been around for some time for defining p-n structures, such as used in diodes, bipolar transistors and high voltage transistors. Silicon structures have limitations in electrical and optical properties.

Recent efforts have been made in obtaining semiconductor devices that do not rely on the properties of silicon. Particularly, attention has been directed to III-V compounds, and more particularly, attention has recently been directed at Galium Nitride (GaN) compounds.

For example, various high electron mobility transistors, light emitting diodes and MIS types of transistors have been disclosed in U.S. Pat. Nos. 5,192,987 and 5,122,845, as well as Japanese Published Application Number 3-273632. These prior references provide GaN type transistor structure that work in the depletion zones with n-conducting layers or are used in an insulating capacity.

SUMMARY OF THE INVENTION

The presently claimed invention, on the other hand, seeks to provide semiconductor devices that can also be used at optical wavelengths for specific purposes, such as high power, high voltage devices.

This is achieved in the present invention by forming p– type GaN on a substrate and using Aluminium Nitride (AlN) as a semi-insulating material for a gate dielectric. This gate insulating material of AlN is formed on the p-type GaN, while n– type GaN is formed at opposite sides of the gate and over the p– type material. The resulting p-n junctions establish high breakdown voltages, enabling larger values of source and drain voltages in transistor structures, for example.

The AlN, grown on the p type GaN layer, is semi-insulating, and its thickness is less than critical layer thickness, ie. around a couple of thousand angstroms. The gate dielectric of AlN is defined by etching around a mask of different masking materials, such as $SiO_2$, $Al_2O_3$, or preferably $Si_3N_4$, by a reactive ion etch (RIE), for example. A selective ion etch is used to form vertical sidewalls of the AlN gate dielectric. While a wet etch might be used, such as KOH, it would be at the expense of avoiding underetching of the AlN gate dielectric. However, such wet etch could etch the p type GaN layer below the bottom level of the gate dielectric of AlN to enable a subsequent underetching of the gate dielectric. Also, ion beam etching where the beam is incident at an angle to the surface of the layers in the epitaxial structure may also be used. This would also rely on the etch rate of GaN being larger then that of AlN.

By the underetching of the gate dielectric, source and drain regions can be formed at opposite sides of and below the gate dielectric. This forms an essential gate-source, drain overlap to define a shortened channel length below the gate dielectric. The source and drain regions are formed by regrowth of either n+ or n– type GaN, or both, on the p type GaN layer. The growth rate at the sidewall of AlN would determine the geometry of the source, drain overlap with the gate. The formation of the source and drain regions can also be carried out by either ion implantation or diffusion, such as with Group VI elements of S or Se, or Group VI elements of Si or Ge, for example.

Other types of FET devices can be formed by the techniques of the present invention. For example, LDMOS type devices can be formed by using n– type GaN regrowth on the p type GaN layer. To form LDMIS devices, for example, first a n– type GaN layer is formed at one side of the AlN gate dielectric followed by the formation of a n+ type GaN layer at the opposite side of the gate dielectric. Both layers would be formed partially below the gate dielectric. A subsequent regrowth of a n+ type GaN layer over part of the n– type GaN layer would lead to the LDMIS device with the appropriate electrode attachments.

While various substrate materials could be used in the present invention, the use of insulating sapphire ($Al_2O_3$) for isolation as the substrate material leads to transparent devices useful for devices. The use of insulating sapphire substrates also offers the advantages of SOI devices. Moreover, both GaN and sapphire have reasonably good values of thermal conductivity which is an advantage for good thermal dissipation in devices. The visible light transparency of GaN would eliminate adverse effects from visible illumination incident on these devices, such as leakage currents, because of the sub-band gap nature of the light. Alternatively, substrates of SiC may be used for its electrical and thermal properties to permit the advantages of a conducting, thick substrate which may be important in suppressing ESD. The use of an AlN buffer layer between a SiC substrate and the GaN layer would permit device designs similar to Si based SOI devices using a thick oxide.

The advantages occurring by the present invention results from the respective band-gap values of both GaN and AlN. GaN has a band-gap energy of about 3.4 eV while AlN has a band-gao energy of about 6.2 eV. The system of GaN-AlN thus has a band-gap that can be varied from about 3.4 to 6.2 eV. A close lattice match also results with these two materials over the entire composition range, especially with the addition of a small fraction of In.

The energy band-gap difference manifests itself as both conduction and valence band discontinuity. Because of the energy band-gap values, the material system is transparent to light in the visible range. The large band-gap results in GaN having a higher value of breakdown electric field for avalanching, ie. 2 to $5\times10^6$ V/cm, compared to $5\times10^5$ V/cm for Si, for example. This enables the p-n junctions on GaN to have larger values of breakdown voltages than Si for comparable values of doping. The large energy band gap values and relatively stable nature of GaN and AlN would permit operation at elevated temperatures with lower leakage currents then available with Si.

In devices operating at high voltages, the carrier transport properties under high field conditions are an important consideration. For example, the forward saturation current would be determined by the carrier saturation velocity at high electric fields in a FET. GaN has an electron saturation velocity of $2\times10^7$ that compares favorably with the value for Si.

The material AlN with a 6.2 eV band-gap can be grown with semi-insulating properties by MOCVD. The AlN layer grown on GaN would be used as the insulating gate dielectric for IGFET devices. The AlN/GaN heterostructure has good interface properties with the AlN thickness less than the critical layer thickness or by adding In, and can be used in conjunction with a gate electrode to induce an inversion layer in GaN. The resulting MISFET structure is capable of being operated at high voltages. Other variations for LDMOS devices can also be incorporated.

The good thermal conductivity values of GaN and sapphire, as well as SiC, for the substrate is an advantage from standpoint of using devices according to the present invention for high power applications. The use of a sapphire substrate offers the same advantages as Si in SOI devices. The reverse leakage current in p-n junctions would not be significantly effected by visible light incident on the device because of the below band-gap nature. Accordingly, the devices according to the present invention can be used in the presence of illumination. Further, the use of transparent ITO contact materials for the gate, source and drain electrodes enable further use in device structures transparent to visible light.

An alternative process of the present invention involves forming the p type GaN on a substrate, forming a layer of n type GaN on the p type layer, etching through a part of the n type layer into a part of the p type layer, and then forming a layer of AlN over the etched parts of the n and p layers to provide the gate dielectric. Subsequent device formation can then be carried out to provide a device according to the present invention.

BRIEF DESCRIPTION OF THE DRAWING FIGURES

The invention will now be described with reference to the drawing figures in which.

DESCRIPTION OF THE INVENTION

Figure 1:
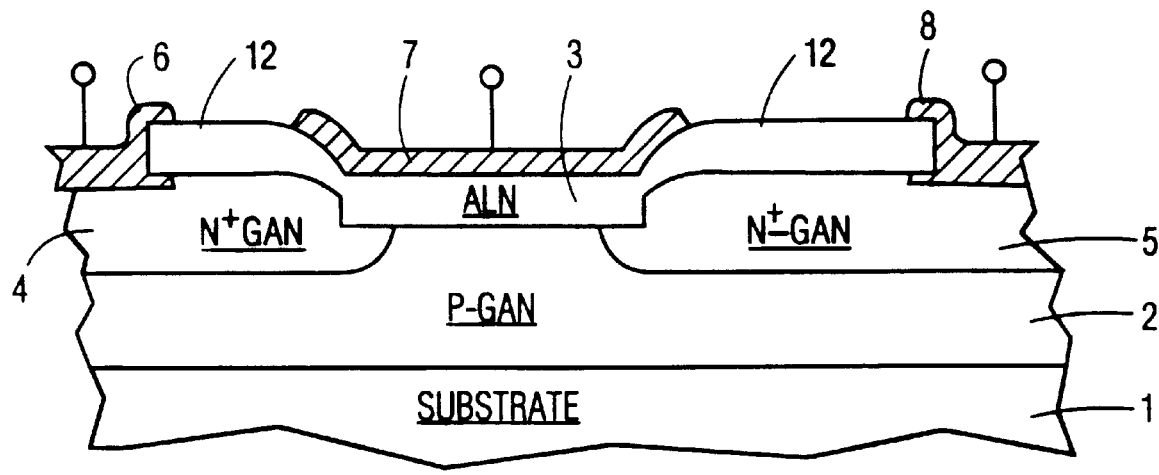
FIG. 1 illustrates a MISFET according to the present invention.

A transistor of the MIS type according to the present invention is shown in FIG. 1. This structure includes a p type layer 2 of GaN on a substrate 1, which may be of a sapphire material. A gate dielectric 3 of AlN is provided on the layer 2 with a layer 4,5 of n+ type GaN at opposite sides of the gate dielectric 3. The n+ type GaN portions 4 and 5 form source and drain regions of the transistor structure with the accompanying electrode contacts 6 and 8 of a conductive material, such as ITO, being provided at ends of insulating extensions 12 at opposite sides of the gate dielectric 3 of AlN. The gate contact 7 is provided in contact with the gate dielectric 3 of AlN.

Figure 2:
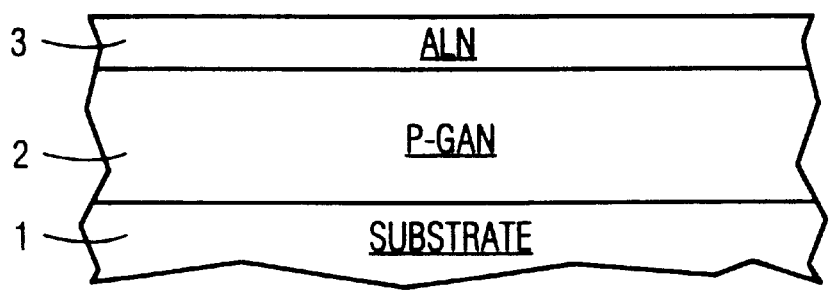
FIGS. 2, 3, 4 and 5 show different stages in the manufacture of the device in FIG. 1.
Figure 3:
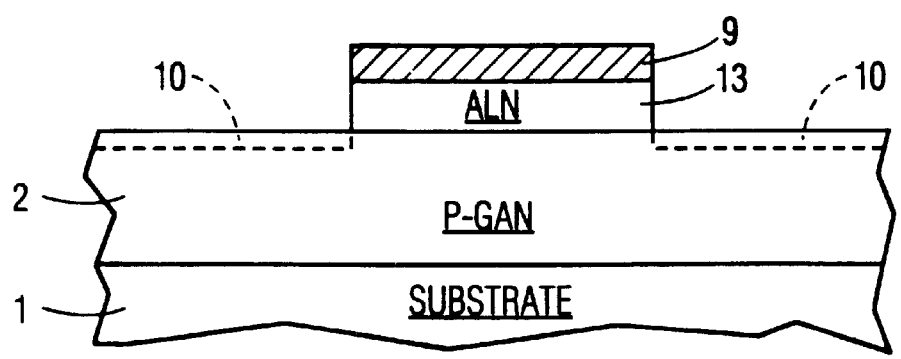

This semiconductor structure is manufactured according to the present invention as shown in FIGS. 2–5. In FIG. 2 a p type layer 2 of GaN is formed on a substrate 1, and overlying layer 3 of at least semi-insulating AlN is formed over the layer 2. The undoped AlN dielectric and the p type GaN form a heterostructure where the AlN layer is formed to a thickness less than its critical layer thickness.

Figure 4:
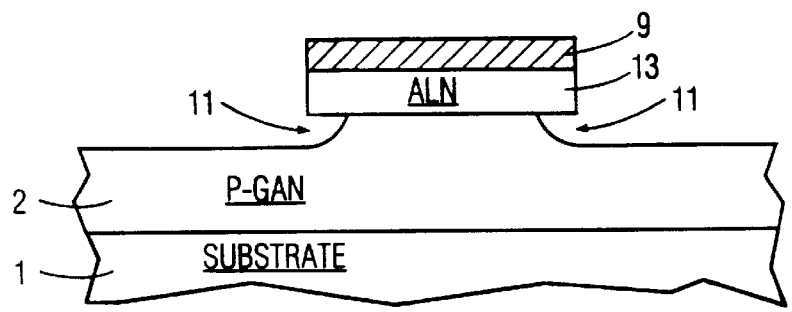

The AlN layer 3 is masked with a layer of $Si_3N_4$ and subsequent etching is carried out to provide a vertical wall gate dielectric 13. A reactive ion etching technique will form the vertical walls although a wet etch could be used at the expense of an undercut under the gate dielectric 13. The p type layer 2 of GaN is etched down to the line 10 in order to provide a subsequent underetch 11 of the layer 2 of GaN beneath the gate dielectric 13, as shown in FIG. 4.

Figure 5:
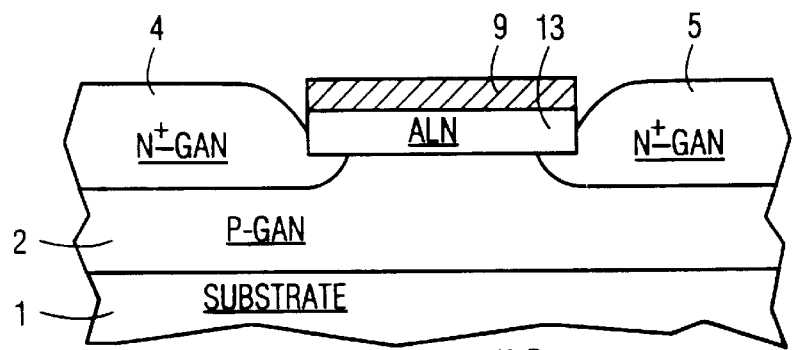

This under cutting of the layer 2 beneath the gate dielectric 13 by a selective isotropic etch, for example, enables the source and drain regions 4,5 of n type GaN to be provided below the gate dielectric, as shown in FIG. 5. The channel region dimension below the gate dielectric 13 is controlled to obtain an overlap of the gate region with the source and drain regions.

The source and drain regions 4,5 are grown by forming layers of n+ type GaN both beneath the gate dielectric portions and over the p type GaN at opposite sides of the gate dielectric 13. The growth rate of the n+ type GaN on the sidewalls of the gate dielectric and the undercut p type GaN determines the geometry of the source, drain-gate overlap.

The subsequent removal of the masking layer 9 and the formation of the extensions 12 of insulating material from the gate dielectric, as shown in FIG. 1, complete the construction of the transistor according to the present invention.

Figure 6:
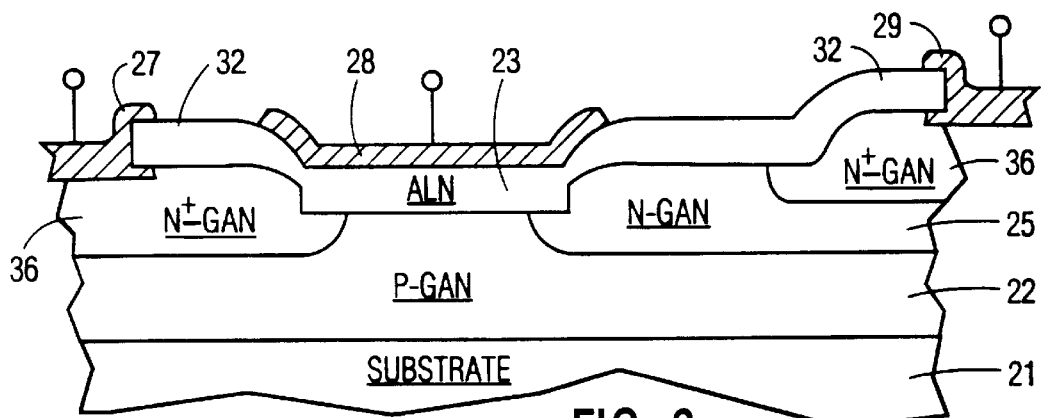
FIG. 6 illustrates a LDMIS-FET according to the present invention.

For LDMOS type devices, a growth of n− type GaN adjacent to the drain area is carried out to form a n− drift region 25 at a side of the gate dielectric 23, as is shown in FIG. 6. The source and drain regions 24 and 26 are then formed of n+ type GaN at sides of the gate dielectric and the drift region, as is shown in FIG. 6.

Figure 7:
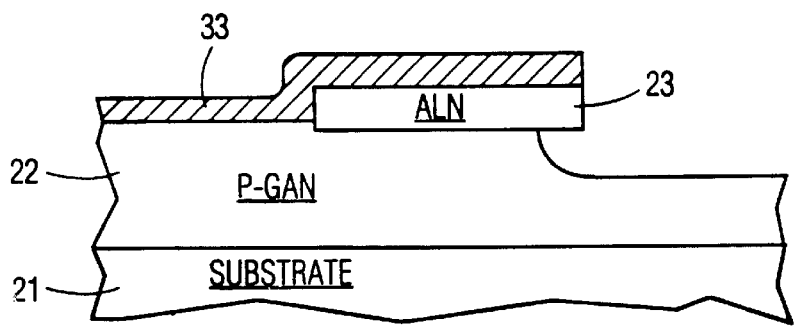
FIGS. 7, 8, 9 and 10 show different stages in the manufacture of the device in FIG. 6.
Figure 8:
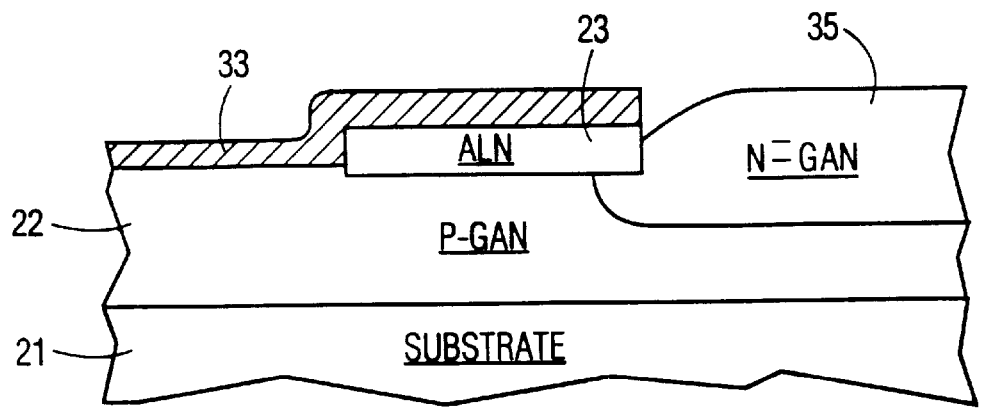

As shown in FIGS. 7, 8, 9 and 10, after the gate dielectric 23 is formed, one side of the device is masked together with the gate dielectric by a mask 33. Etching and undercutting is then carried out at one side of the gate dielectric as shown in FIG. 7. Thereafter, the n− type layer 35 of GaN is formed at that side of the gate dielectric, both partially below the gate dielectric 23 and over the p+ type layer 22 of GaN at that side of the gate dielectric, as is shown in FIG. 8.

Figure 9:
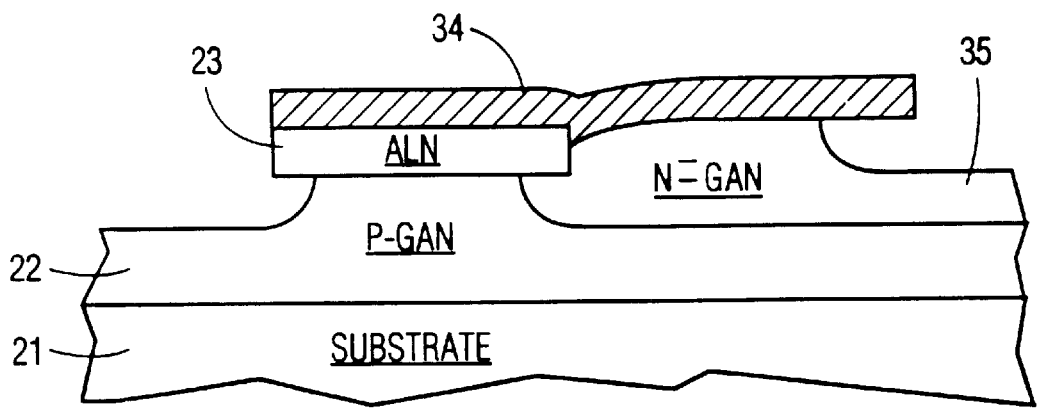

Then the masking layer 33 overlying the one side of the layer and the gate dielectric is removed and a second masking layer 34, covering the gate dielectric and part of the n− layer 35, is formed. Etching is then carried out of the unmasked portions of the p type GaN layer 22 to undercut the gate dielectric at the side opposite to the n− layer 35 and the uncovered portion of the layer 35, as is shown in FIG. 9.

Figure 10:
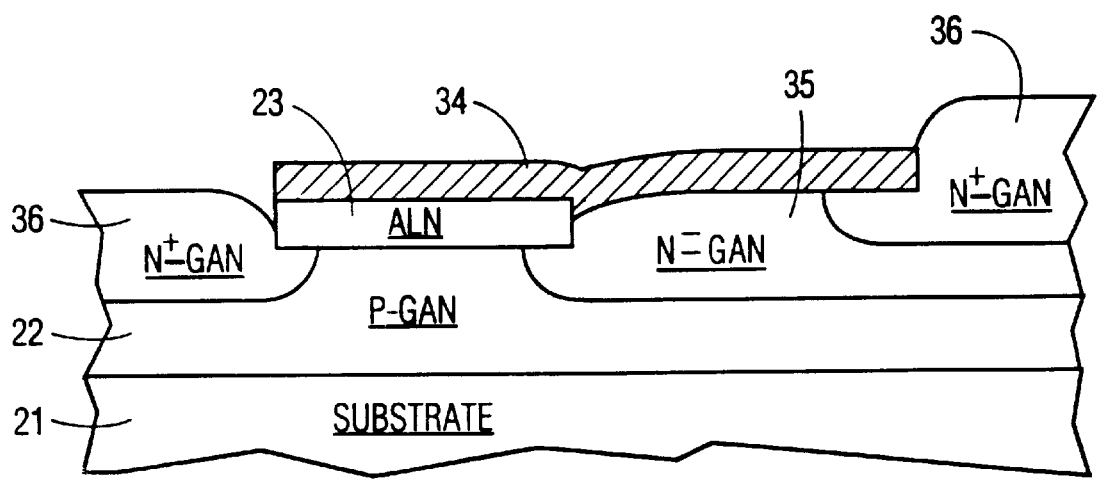

Then n+ portions 36 of GaN are formed both adjacent to the gate dielectric 23 and over the undercut part of the n− layer 35, as shown in FIG. 10. Appropriate source and drain electrical contacts 27, 29 are formed, together with gate contact 28, relative to insulating portions 32 extending from the gate dielectric, as seen in FIG. 6.

Figure 11A:
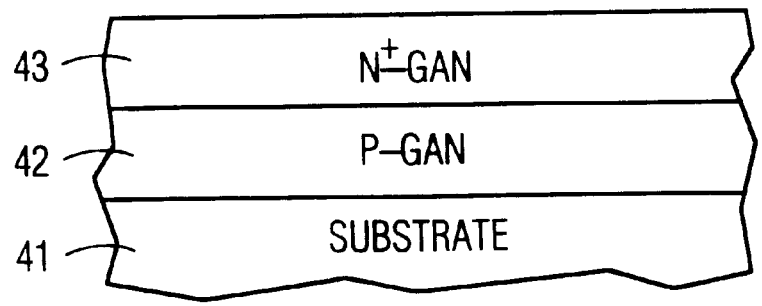
FIGS. 11A, 11B and 11C show different stages in an alternate technique according to the present invention.
Figure 11B:
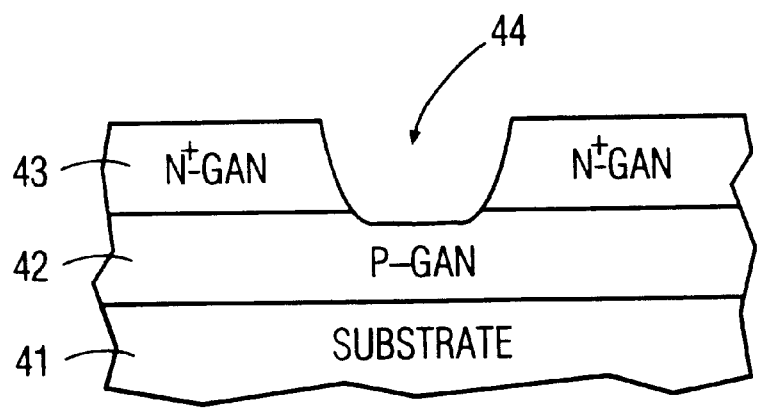
Figure 11C:
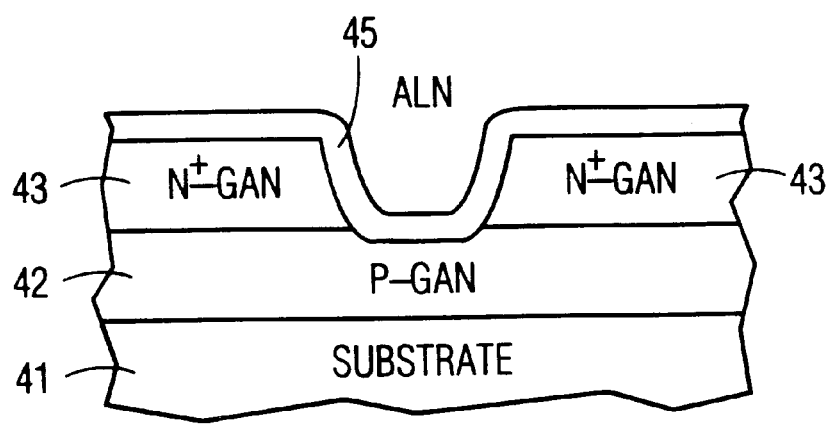

In an alternative to the manufacturing process for the present invention, an n+ type layer 43 of GaN can be grown over a p type layer 42 on a substrate 41, as seen in FIG. 11A. Thereafter, etching is carried out through the n+ layer 43 into the p type layer 42, such as seen in FIG. 11B, to form the cavity 44. Finally, a layer 45 of AlN is grown in the cavity and over the exposed surfaces of the n+ layer 43. Formation of contacts can be further carried out along the lines shown with respect to the devices of FIG. 1 and 6.

As further alternatives, ion implantation or diffusion processes can be carried out to form the source and drain regions. The use of transparent contact materials, such as ITO, would make the present invention transparent to visible light.

What we claim:

1. In a method of manufacturing high voltage semiconductor devices, the steps comprising
   (a) forming a layer of one conductivity type GaN on a substrate, (b) forming a semi-insulating layer of AlN on said layer of GaN, (c) masking portions of the layer of AlN, (d) etching said layer of AlN and portions of said GaN below masked portions of AlN, and (e) forming an opposite conductivity type GaN over said one conductivity type GaN and into areas below said masked portions of AlN to provide p-n junctions.

2. A method according to claim 1, wherein said one conductivity type GaN is p type while said opposite conductivity type GaN is n type.

3. A method according to claim 2, wherein said opposite conductivity type GaN formed in step (e) is n+ type GaN.

4. A method according to claim 1, wherein at least part of said opposite conductivity type GaN is n− type GaN.

5. A method according to claim 1, further comprising the steps of forming electrical contacts to each of said AlN and parts of said opposite conductivity type GaN at opposite sides of said AlN.

6. In a method of manufacturing high voltage semiconductor devices, the steps comprising (a) forming a layer of GaN of one conductivity type on a substrate, (b) forming a layer of GaN of an opposite type conductivity on said layer of GaN of said one conductivity type, (c) etching through said layer of opposite conductivity type GaN into said layer of one conductivity type GaN to form a cavity, and (d) forming a layer of semi-insulating AlN over said opposite conductivity type layer of GaN into said cavity.

7. A method according to claim 6, further comprising the steps of forming electrical contacts to each of said AlN and parts of said opposite conductivity type GaN at opposite sides of said cavity.

* * * * *